(12) United States Patent
Nuzzarello et al.

(10) Patent No.: US 7,002,399 B2
(45) Date of Patent: Feb. 21, 2006

(54) BASIC STAGE FOR A CHARGE PUMP CIRCUIT

(75) Inventors: Giovanni Nuzzarello, Cinisello Balsamo (IT); Jacopo Mulatti, Latisana (IT)

(73) Assignee: STMicroelectronics, S.r.l., (IT)

( * ) Notice: Subject to any disclaimer, the term of this patent is extended or adjusted under 35 U.S.C. 154(b) by 0 days.

(21) Appl. No.: 10/402,852

(22) Filed: Mar. 28, 2003

(65) Prior Publication Data

US 2003/0214347 A1 Nov. 20, 2003

(30) Foreign Application Priority Data

Mar. 28, 2002 (EP) ................................. 02425199

(51) Int. Cl.
G05F 3/16 (2006.01)
(52) U.S. Cl. ........................ 327/536; 327/537; 363/60
(58) Field of Classification Search ................ 327/536, 327/537; 363/59, 60; 365/189.09, 226
See application file for complete search history.

(56) References Cited

U.S. PATENT DOCUMENTS

| | | | |
|---|---|---|---|
| 4,068,295 A | | 1/1978 | Portmann |
| 5,172,013 A | | 12/1992 | Matsumura |
| 5,874,850 A | | 2/1999 | Pulvirenti et al. |
| 6,100,557 A | | 8/2000 | Hung et al. |
| 6,107,864 A | * | 8/2000 | Fukushima et al. ......... 327/536 |
| 6,252,429 B1 | * | 6/2001 | Assaderaghi et al. ........ 327/55 |
| 6,316,986 B1 | | 11/2001 | Ferrant et al. |
| 6,366,482 B1 | * | 4/2002 | Jeong .......................... 363/60 |
| 6,429,723 B1 | * | 8/2002 | Hastings ..................... 327/536 |
| 6,498,527 B1 | * | 12/2002 | Matsumoto .................. 327/536 |
| 2003/0122611 A1 | * | 7/2003 | Min ............................ 327/536 |

OTHER PUBLICATIONS

Maksimovic et al., "Switched-Capacitor DC-DC Converters for Low-Power On-Chip Applications", 1999 IEEE, vol. 1, pp. 54-59.*
Maksimovic D. et al., Switched-Capacitor DC-DC Converters for Low-Power On-Chip Applications, 30th Annual IEEE Power Electronics Specialists Conference. PESC 99. Record. Charleston, Annual Power Electronics Specialists Conference, New York, NY: IEE, US, vol. 1, pp. 54-59, Xp000924707.

* cited by examiner

Primary Examiner—Timothy P. Callahan
Assistant Examiner—Terry L. Englund
(74) Attorney, Agent, or Firm—Graybeal Jackson Haley LLP

(57) ABSTRACT

A basic stage for a charge pump circuit having at least an input terminal and an output terminal and comprising: at least a first inverter inserted between said input and output terminals and comprising a first complementary pair of transistors, defining a first internal node, at least a second inverter inserted between said input and output terminals and comprising a second complementary pair of transistors, defining a second internal node, respective first and second capacitors connected to said first and second internal nodes and receiving first and second driving signals; the first and second pairs of transistors having the control terminals cross-connected to the second and first internal nodes. Advantageously, the basic stage comprises at least a first biasing structure connected to the first and second internal nodes and comprising first and second biasing transistors, which are respectively coupled to said first and second inverters.

13 Claims, 3 Drawing Sheets

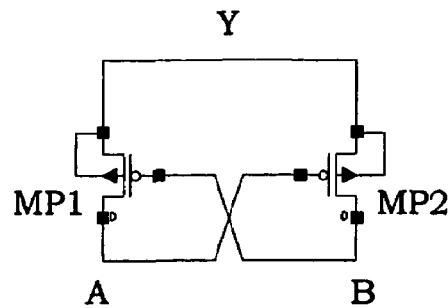
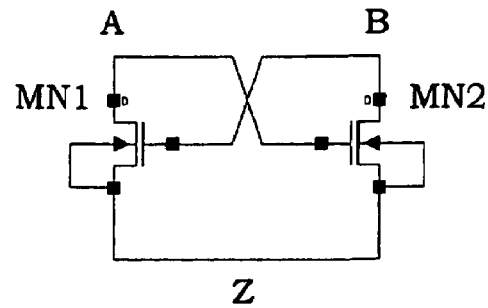
FIG. 6          FIG. 7
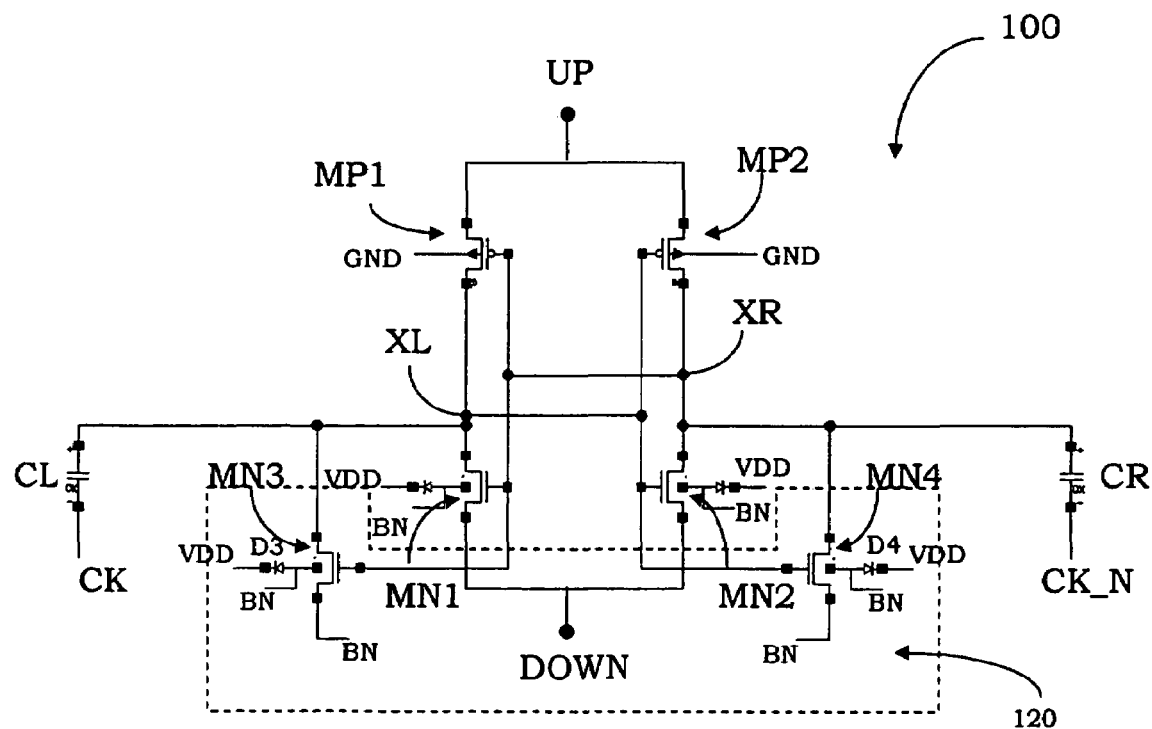
FIG. 8

BASIC STAGE FOR A CHARGE PUMP CIRCUIT

PRIORITY CLAIM

This application claims priority from European patent application No. 02425199.3, filed Mar. 29, 2002, which is incorporated herein by reference.

TECHNICAL FIELD

The present invention relates generally to a basic stage for a charge pump circuit.

More specifically, the invention relates to a basic stage for a charge pump circuit having at least an input terminal and an output terminal, and comprising: at least a first inverter inserted between said input and output terminals and comprising a first complementary pair of transistors defining a first internal node, at least a second inverter inserted between said input and output terminals and comprising a second complementary pair of transistors defining a second internal node, respective first and second capacitors connected to said first and second internal nodes and receiving a first and second driving signals: said first and second pairs of transistors having the control terminals cross-connected to said second and first internal nodes.

The invention relates particularly, but not exclusively, to a charge pump circuit for generating positive and negative voltages suitable for use in non volatile memory devices and the following description is made with reference to this field of application for convenience of illustration only.

BACKGROUND OF THE INVENTION

As it is well known, semiconductor non-volatile memories, such as EPROM, EEPROM and flash memories, require, for the correct operation thereof, voltage values which are higher than a supply voltage reference VDD, and lower than a ground voltage reference GND.

In particular, the erasing operation of a non-volatile memory requires a positive overvoltage equal to about 10 volts (V) as well as a negative overvoltage equal to –8V, both generated from a supply voltage reference ranging between 1.8V and 5V and a ground voltage reference GND, that is conventionally equal to 0V.

To generate these positive and negative overvoltages, charge pump circuits are presently used. These circuits are generally realized by cascading a plurality of basic stages.

The most common charge pump circuit is the four-phase charge pump circuit, comprising a cascade of N driven basic stages, each one being driven by the two phases of a clock signal CK and \CK. For the correct operation of such a circuit, two consecutive basic stages must be driven by different phases and, thus, four phases are required to drive the whole charge pump circuit.

A basic stage for a known charge pump circuit is schematically shown in FIG. 1, globally indicated with 1.

The basic stage 1 has an input terminal IN connected to the input terminal of the charge pump circuit, if it is the first stage, or to an output terminal of a previous stage, as well as an output terminal connected to an input terminal of a following stage or to the output terminal of the charge pump circuit, if it is the last stage.

The basic stage 1 comprises first M1 and second M2 MOS transistors of the N-channel type having the conduction terminals connected to said input terminal IN and to first C1 and second C2 capacitors in correspondence with an internal circuit node X and of the output terminal OUT respectively. The transistors M1 and M2 also have the control terminals cross-connected to the output terminal OUT and to the internal circuit node X respectively.

The basic stage 1 also has first CK and second \CK driving signals applied to the capacitors C1 and C2; these driving signals being one opposite to the other.

It should be noted that only the second capacitor C2 is used for the charge transfer performed by the basic stage 1, the first capacitor C1 aiming only at generating a high overdrive voltage during the charging of the second capacitor C2.

The transistors M1 and M2 used in known charge pump circuits are usually of the "high-voltage" type since they must support a voltage being twice the circuit supply voltage VDD, applied to the control terminal thereof in particular operating conditions.

The cascade structure of a charge pump circuit using basic stages like the stage 1 is schematically shown in FIG. 2 and globally indicated with 2. The charge pump circuit 2 comprises a plurality of basic stages S1, S2, . . . , SN, each stage having the structure shown in FIG. 1.

It should be noted that the charge pump circuit 2 uses four driving signals A, \A, B and \B suitable to ensure a constant output power supply. In particular, they are step signals with different phases as shown in FIG. 3: it is, thus, possible to use frequencies that are too high since there is the risk of losing the right correlation required for the correct operation of the charge pump circuit 2.

The charge pump circuit 2 according to the prior art also requires a further output stage to reduce the ripple at the output terminal OUT of the last stage SN.

Also known is the use of a two-phase charge pump circuit, comprising a plurality of basic stages, both using the capacitors comprised in the structure to transfer the power at the output terminal.

Such a charge pump circuit is described, for example, in Italian patent application No. TO 2002A000158, filed on Feb. 25, 2002 which is filed in the name of the Applicant.

Particularly, the charge pump circuit according to this document comprises a plurality of basic stages as the one schematically shown in FIG. 4 and globally indicated with 3.

The basic stage 3 has a first node UP corresponding to the highest voltage node and a second node DOWN corresponding to the lowest voltage node.

Particularly, the node UP can be connected to the output terminal of a charge pump circuit comprising the basic stage 3 or to the input terminal (DOWN) of a following stage, while the node DOWN can be connected to a supply reference or to an output terminal (UP) of a previous stage.

The basic stage 3 comprises first MP1 and second MP2 MOS transistors of the P-channel type, having the conduction terminals connected to the node UP and to a first XL and second XR internal circuit nodes, respectively. The basic stage 3 also comprises third MN1 and fourth MN2 MOS transistors of the N-channel type, having the conduction terminals connected to the internal circuit nodes XL and XR, respectively, and to the node DOWN.

The first MP1 and third MN1 transistors realize a first inverter inserted between the nodes UP and DOWN and having the first internal circuit node XL as central point. Similarly, the second MP2 and the fourth MN2 transistors realize a second inverter inserted between the nodes UP and DOWN and having the second internal circuit node XR as central point.

The first transistor MP1 also has the control terminal connected to the control terminal of the third transistor MN1 as well as to the second internal circuit node XR. Similarly, the second transistor MP2 also has the control terminal connected to the control terminal of the fourth transistor MN2 as well as to the first internal circuit node XL.

The first and second transistors MP1 and MP2 also have the bulk terminals connected to the node UP, while the third MN1 and the fourth MN2 transistors have the bulk terminals connected to the node DOWN.

The basic stage 3 also comprises first CL and second CR capacitors connected to the nodes XL and XR, respectively, and receiving first CK and second CK_N driving signals.

It should be noted that the PMOS transistors MP1 and MP2 have the function of multiplexing the voltage values at the nodes XL and XR, connecting the highest voltage value node to the node UP.

The charge pump circuit obtained through a cascade of basic stages like the stage 3 requires only two driving signals and it is referred to as two-phase charge pump circuit. This allows higher frequencies to be used for these signals without risking the loss of synchronism of the basic stage cascade.

Moreover such a two-phase charge pump circuit has a voltage value which is substantially constant at the output terminal (corresponding to the node UP of the last cascade stage). The output voltage stability allows low-voltage transistors to be used, these transistors having lower size and greater conductivity characteristics with respect to the high-voltage transistors used in the four-phase charge pump circuits.

In substance, a two-phase charge pump circuit shows the following advantages: greater efficiency of the output power/input power ratio; possibility of using high frequency driving signals, thus decreasing the size of the capacitors to be used; and possibility of using low-voltage transistors, with a further decrease in the area occupied by the charge pump circuit.

Although advantageous in many aspects, this solution also shows several drawbacks. In particular, the charge pump circuit realized by means of the cascade of basic stages 3 has latch-up problems that can be caused by: forward biasing of the junctions P+/Nwell of the P-type MOS transistors; forward biasing of the junctions N+/Pwell of the N-channel MOS transistors. Suitable arrangements must, therefore, be provided in the layout phase of the charge pump circuit to avoid such a latch-up phenomenon.

Moreover, through the basic stage 3, it is impossible to realize a negative charge pump having only one stage, since the Nwell of the PMOS transistors cannot reach negative voltage values.

SUMMARY OF THE INVENTION

Therefore, an embodiment an the present invention is to provide a basic stage for a charge pump circuit, having such structural and functional characteristics as to avoid latch-up phenomena, allowing, in the meanwhile, a negative charge pump circuit to be realized and, thus, overcoming the limits of the charge pump circuits according to the prior art.

This embodiment biases, in a suitable way, the bulk terminals of the transistors comprised in each basic stage of the charge pump circuit to avoid any forward bias of the junctions thereof, thus obtaining a unique layout for positive and negative charge pump circuits.

BRIEF DESCRIPTION OF THE DRAWINGS

The features and advantages of the circuit according to the invention will be apparent from the following description of an embodiment thereof given by way of non-limiting example with reference to the attached drawings, wherein:

FIGS. 6 and 7 schematically show some details of the basic stage of FIG. 5 in different operating conditions; and FIG. 8 schematically shows a different embodiment of the basic stage of FIG. 5.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
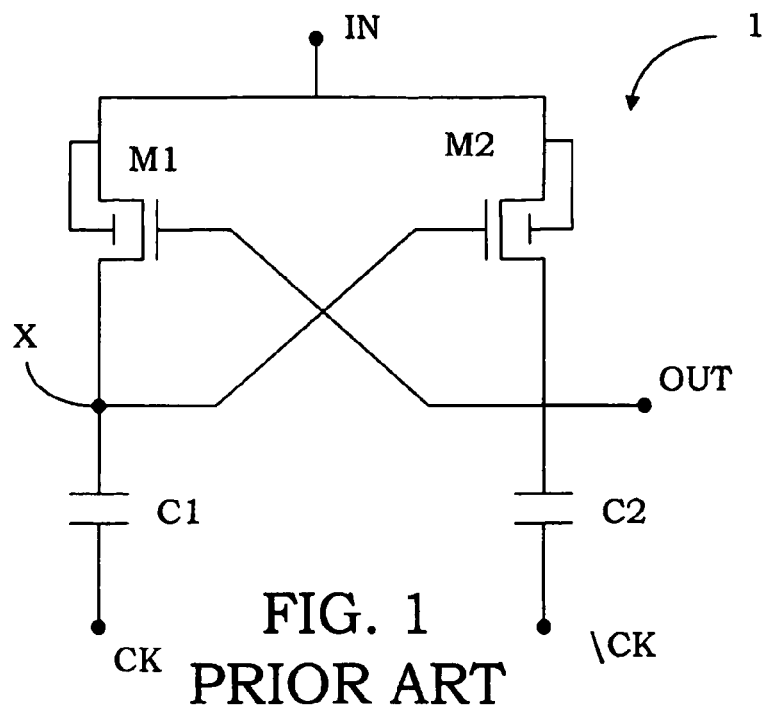
FIG. 1 schematically shows a basic stage for a four-phase charge pump circuit according to the prior art.
Figure 2:
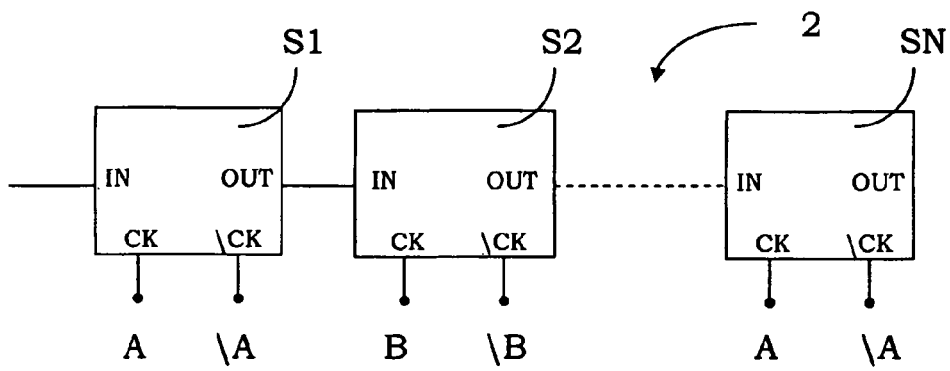
FIG. 2 schematically shows a conventional four-phase charge pump circuit realised by using the basic stages of FIG. 1.
Figure 3:
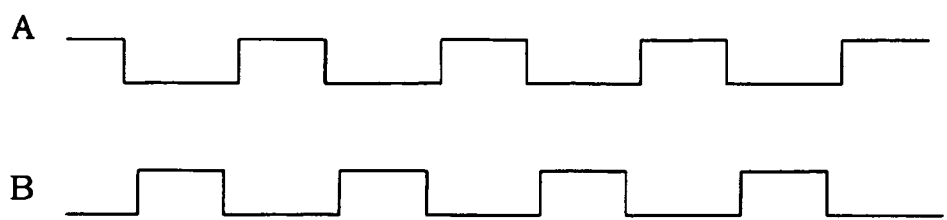
FIG. 3 schematically shows the driving signals pattern of the charge pump circuit of FIG. 2.
Figure 4:
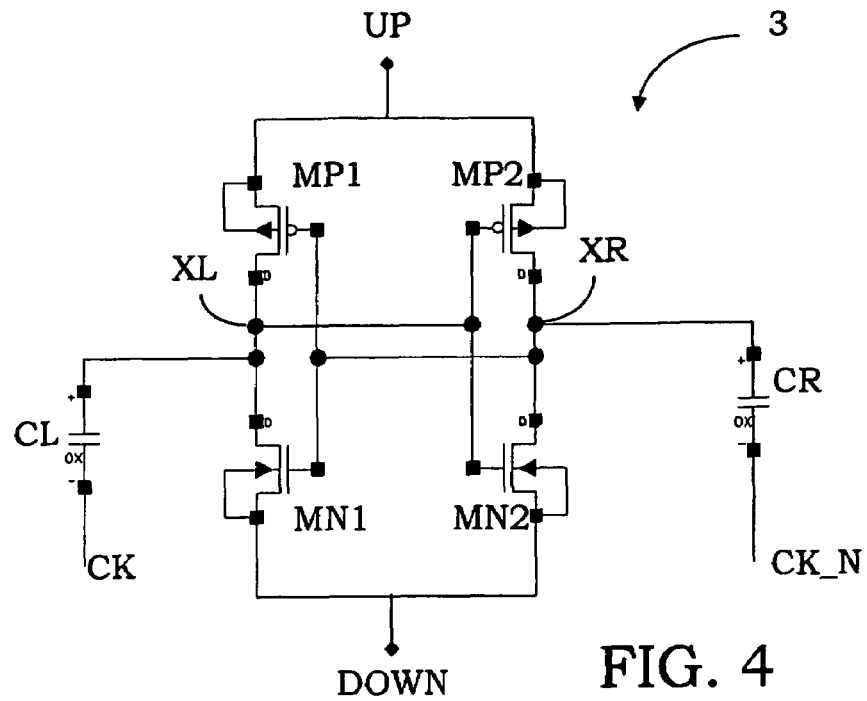
FIG. 4 schematically shows a basic stage for a two-phase charge pump circuit according to the prior art.
Figure 5:
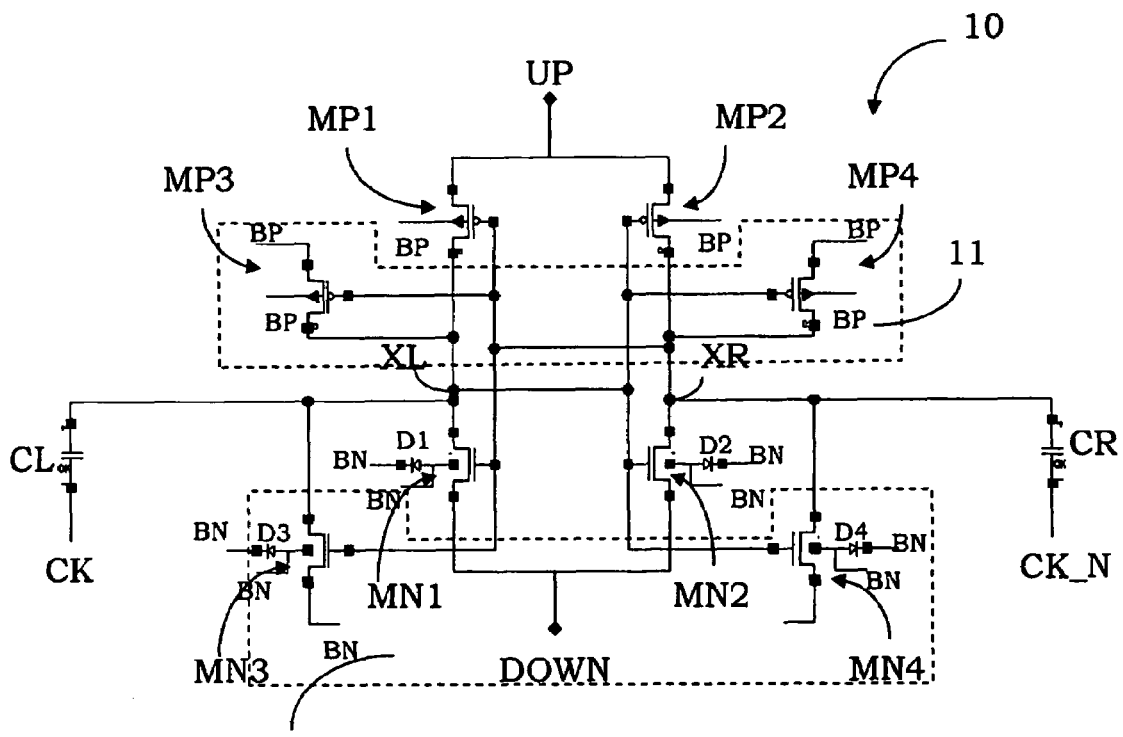
FIG. 5 schematically shows a basic stage for a two-phase charge pump circuit according to an embodiment of the invention.

With reference to the drawings, and particularly to FIG. 5, a basic stage for a two-phase charge pump circuit according to an embodiment of the invention is globally and schematically indicated with 10.

Elements which are structurally and functionally identical to the basic stage described with reference to the prior art will be indicated with the same numerical references for convenience of illustration.

In particular, the basic stage 10 has a first node UP corresponding to the highest voltage node and a second node DOWN corresponding to the lowest voltage node.

As already seen with reference to the prior art, the node UP can be connected to the output terminal of a charge pump circuit comprising the basic stage 3 or to the input terminal (DOWN) of a following stage, while the node DOWN can be connected to a supply reference or to an output terminal (UP) of a previous stage.

The basic stage 10 comprises first MP1 and second MP2 MOS transistors of the P-channel type, having the conduction terminals connected to the node UP and to first XL and second XR internal circuit nodes, respectively. The basic stage 10 also comprises third MN1 and fourth MN2 MOS transistors of the N-channel type, having the conduction terminals connected to the internal circuit nodes XL and XR, respectively, and to the node DOWN.

The first MP1 and third MN1 transistors realize a first inverter inserted between the nodes UP and DOWN and having the first internal circuit node XL as central point. Similarly, the second MP2 and fourth MN2 transistors realize a second inverter inserted between the nodes UP and DOWN and having the second internal circuit node XR as central point.

The first transistor MP1 also has the control terminal connected to the control terminal of the third transistor MN1 as well as to the second internal circuit node XR. Similarly, the second transistor MP2 also has the control terminal connected to the control terminal of the fourth transistor MN2 as well as to the first internal circuit node XL.

Substantially, the transistors MP1 and MP2 select the highest voltage node between the first XL and second XR internal circuit nodes and they connect it to the node UP, while the transistors MN1 and MN2 select the lowest voltage node between the first XL and second XR internal circuit nodes and they connect it to the node DOWN.

The basic stage 10 also comprises first CL and second CR capacitors connected to the nodes XL and XR, respectively, and receiving first CK and second CK_N driving signals. In particular, the second driving signal CR_N is the logic negation of the first driving signal CK.

Advantageously, according to an embodiment of the invention, the basic stage 10 also comprises a first biasing structure 11 connected to the control terminals of the PMOS transistors MP1 and MP2, as well as to the internal circuit nodes XL and XR.

In particular, the first biasing structure 11 comprises a first MOS biasing transistor MP3 of the P-channel type, having a control terminal connected to the control terminal of the first transistor MP1, as well as a drain terminal connected to the first internal circuit node XL. Further, the first biasing transistor MP3 receives a first biasing signal BP at the source and bulk terminals thereof, the signal BP also being applied to the bulk terminal of the first transistor MP1.

Similarly, the first biasing structure 11 comprises a second MOS biasing transistor MP4 of the P-channel type, having a control terminal connected to the control terminal of the second transistor MP2, as well as a drain terminal connected to the second internal circuit node XR. Further, the second biasing transistor MP4 receives a first biasing signal BP on the source and bulk terminals thereof, the signal BP also being applied to the bulk terminal of the second transistor MP2.

The first biasing structure 11 comprises transistors MP3 and MP4 having far smaller size with respect to the size of the transistors MP1 and MP2 of the basic stage 10 of the charge pump. Substantially, the first biasing structure 11 has the same function as the transistors MP1 and MP2, i.e., it selects the highest voltage node between the first XL and second XR internal circuit nodes and connects such a highest voltage node to the bulk terminals of the PMOS transistors, forcing the value of the first biasing signal BP.

The main difference is that the node UP of the basic stage 10 is the input of a following stage in the charge pump circuit and it is necessarily a high-value capacitive load, while the bulk terminals of the PMOS transistors are connected only to the NWELL wherein those transistors are realized.

Therefore, advantageously according to an embodiment of the invention, the forward bias of the p+/NWELL junctions of the transistors MP3 and MP4 occurs with far lower currents than the current of the known structure comprising only the transistors MP1, MP2, MN1 and MN2. In fact, the quantity of current involved in that junction is proportional to the ratio between the capacities among which the charge is reassessed and the capacity of the NWELL with respect to the capacitors CL and CR of the basic stage of the charge pump is lower by two orders of magnitude.

In other words, the transistors MP3 and MP4 of the first biasing structure 11 force the node UP to the highest voltage value at the internal circuit nodes XL and XR in advance with respect to the transistors MP1 and MP2 of the basic stage 10 of the charge pump.

Advantageously, according to an embodiment of the invention, the basic stage 10 also comprises a second biasing structure 12 connected to the control terminals of the NMOS transistors MN1 and MN2, as well as to the internal circuit nodes XL and XR.

Particularly, the second biasing structure 12 comprises a third MOS biasing transistor MN3 of the N-channel type, having a control terminal connected to the control terminal of the third transistor MN1, as well as a drain terminal connected to the first internal circuit node XL. Further, the third biasing transistor MN3 receives a second biasing signal BN on the source and bulk terminals thereof, the signal BN also being applied to the bulk terminal of the third transistor MN1.

Moreover, symmetrically, the second biasing structure 12 comprises a fourth MOS biasing transistor MN4 of the N-channel type, having a control terminal connected to the control terminal of the fourth transistor MN2, as well as a drain terminal connected to the second internal circuit node XR. Further, the fourth biasing transistor MN4 receives the second biasing signal BN on the source and bulk terminals thereof, the signal BN also being applied to the bulk terminal of the fourth transistor MN2.

Similar to the above description concerning the first biasing structure 11, the second biasing structure 12 also comprises transistors MN3 and MN4 having far smaller size with respect to the size of the transistors MN1 and MN2 of the basic stage 10 of the charge pump. Substantially, the second biasing structure 12 has the same function as the transistors MN1 and MN2, i.e., it selects the lowest voltage node between the first XL and second XR internal circuit nodes, and it connects such lowest voltage node to the bulk terminals of the NMOS transistors, forcing the value of the second biasing signal BN.

The main difference is that the node DOWN of the basic stage 10 is the input of a previous stage in the charge pump circuit and it is necessarily a high-value capacitive load, while the bulk terminals of the NMOS transistors are connected only to the PWELL wherein those transistors are realized.

Therefore, advantageously according to an embodiment of the invention, the forward bias of the N+/PWELL junctions of the transistors MN3 and MN4 occurs with very lower currents when compared to the current of the known structure comprising only the transistors MP1, MP2, MN1 and MN2. In fact, the quantity of current involved in that junction is proportional to the ratio between the capacities among which the charge is reassessed and the capacity of the PWELL with respect to the capacitors CL and CR of the basic stage of the charge pump is lower by two orders of magnitude.

In other words, the transistors MN3 and MN4 of the second biasing structure 12 force the node DOWN to the lowest voltage value at the internal circuit nodes XL and XR in advance with respect to the transistors MN1 and MN2 of the basic stage 10 of the charge pump.

It should be noted that the NMOS transistors are realized in a triple-well technology and they have a first bulk terminal corresponding to the PWELL and a second well terminal corresponding to the NWELL of the triple-well structure, represented in FIG. 5 as connected to the bulk terminal by means of respective diodes D1, D2, D3 and D4. Moreover, the biasing of the NWELL and PWELL is not provided by outer signals, but it is generated in each basic stage (signals BP and BN) or it is forced to the voltage references VDD and GND.

The operation of the basic stage 10 according to the invention will be now described in greater detail in different operating conditions.

If the first driving signal CK is at a high logic value, the first internal circuit node XL is at a highest voltage value; thus, that first node XL corresponds to the source terminal of the first transistor MP1 and of the first biasing transistor MP3.

The second internal circuit node XR is, on the contrary, at a lower potential since it is driven by the second driving signal CK_N, which is the negation of the first driving signal CK.

Under these conditions, the first biasing signal BP brings the bulk terminals of the PMOS transistors MP1, MP2, MP3 and MP4 at a higher potential value avoiding the forward bias of the P+/Nwell junctions of such transistors.

Moreover, the second transistor MP2 is off, the control and source terminals thereof being at the same potential.

Similarly, if the first driving signal CK is at a low logic value, the first internal circuit node XL is at the lowest voltage value: that first node XL corresponds to the source terminal of the third transistor MN1 and of the third biasing transistor MN3.

On the contrary, the second internal circuit node XR is at a higher potential since it is driven by the second driving signal CK_N, which is the negation of the first driving signal CK.

Under these conditions, the second biasing signal BN brings the bulk and well terminals of the NMOS transistors MN1, MN2, MN3 and MN4 at a lower potential value, thereby avoiding the forward bias of the N+/Pwell junctions of such transistors.

Moreover, the fourth biasing transistor MN2 is off, the control and source terminals thereof being at the same potential.

The described basic stage 10 is, thus, used to realize a positive charge pump circuit, forcing the bulk terminals of the transistors MP1, MP2, MP3 and MP4, corresponding to a single contact NWELL of all the PMOS transistors, to the value of the first biasing signal BP, forcing the bulk terminals of the transistors MN1, MN2, MN3 and MN4, corresponding to a single contact PWELL of all the NMOS transistors of each basic stage, to the value of the second biasing signal BN and forcing the terminal NWELL of the triple-WELL structure, wherein the NMOS transistors are realized, to the value of the second biasing signal BN.

The P-type substrate is also ground-biased.

It should be noted that the biasing structures 11 and 12 are self-consistent and they achieve the function $|V_A-V_B|>V_T$, $V_A$ and $V_B$ being the voltage values at the drain terminals of the transistors MP1 and MP2 and $V_T$ being the threshold voltage value of those transistors.

Particularly, the operation of the basic stage 10 with the first biasing structure 11 can be simplified as schematically shown in FIG. 6, wherein the transistors MP1 and MP@ have the bulk terminals connected to the node UP, whose voltage value Y is equal to the highest value between $V_A$ and $V_B$:

$$Y=max(V_A, V_B)$$

The scheme of FIG. 6 takes into account voltage values Y higher than 0V, owing to the biasing of the wells Nwell of the PMOS transistors MP1 and MP2.

It is, however, possible to extend these considerations to negative voltage values Y, if the technology allows it, as in the case of SOI technology.

For negative voltage values Y, it is also possible to force the bulk terminal of the PMOS transistors to ground, keeping, however, above the highest bulk-source voltage value which can be supported by the transistors being used.

Similarly, the operation of the basic stage 10 with the second biasing structure 12 can be simplified as schematically shown in FIG. 7, wherein the transistors MN1 and MN2 have the bulk terminals connected to the node DOWN, whose voltage value Z is equal to the lowest voltage value between $V_A$ and $V_B$ at the drain terminals of the transistors MN1 and MN2:

$$Z=min(V_A, V_B)$$

The voltage values Z have no limitations for the well-known and widely-used triple-well NMOS technologies provided that, for negative voltage values Z, the Nwell and Pwell terminals of the stage 10 are connected to each other.

Advantageously, according to an embodiment of the invention, the basic stage 10 can be used also to realize a charge pump circuit for a negative voltage.

For this purpose, it is necessary to connect to ground the node UP of a first basic stage out of a chain of stages comprised in the charge pump circuit for a negative voltage and the node DOWN of this first basic stage to a node UP of a following stage.

In other words, it is possible to use a basic stage 10 for a negative charge pump circuit by simply connecting the node UP to the ground voltage reference GND and drawing the stage output from the node DOWN.

With respect to the structure for a positive charge pump as previously shown, the NWELL of the triple-well structure, wherein the NMOS transistors are realized, is connected to the supply voltage reference VDD (and it does not receive the second biasing signal BN anymore, as seen for the positive pump basic stage). Therefore, the terminal of the PWELL wherein the NMOS transistors are realized can be brought to negative voltages without bringing the NWELL containing it underground, since it is separately biased at a no negative potential value (in the example shown, the supply voltage reference VDD).

On the contrary, it is not necessary to change the biasing of the NWELL wherein the PMOS transistors are realized. In fact, the highest voltage value at the nodes XL and XR varies from the negative supply voltage value (-VDD) and a value ox which is certainly positive and lower than the positive supply voltage value VDD, ensuring the correct biasing of that NWELL.

Such a basic stage 10 represents a charge pump circuit having only one stage.

It is also possible to realize a negative charge pump circuit through a chain of basic stages 10.

In particular, the first basic stage to be used in such a chain has the bulk terminals of the PMOS transistors, corresponding to the only terminal of the NWELL wherein they are realized, biased through the first biasing signal BP, the bulk terminals of the NMOS transistors, corresponding to the terminal of the PWELL wherein they are realized, biased through the second biasing signal BN and the terminal of the well NWELL of the triple-well structure wherein they are realized the NMOS transistors connected to the supply voltage reference VDD.

The P-type substrate is still ground-biased.

The basic stages following the first one in the chain comprising the negative pump circuit have, on the contrary, the bulk terminals of the PMOS transistors, corresponding to the single terminal of the NWELL wherein they are realized, biased to ground GND.

In fact, in this case the output voltage of the previous stages in the chain is certainly negative and the structure for biasing the bulk terminals of the PMOS transistors cannot be used since the NWELL containing them cannot be biased at negative voltage values which would direct-connect the parasitic diode NWELL/P-type substrate (always connected to the ground reference GND).

To overcome this drawback, the NWELL of the PMOS transistors is thus forced to ground GND.

Thus, the biasing transistors MP3 and MP4 lose their function. In order to keep the same structure for all the basic stages, these transistors MP3 and MP4 are parallel-connected to the transistors MP1 and MP2 of the charge pump basic stage.

It is also possible to eliminate the biasing structure 11 comprising the transistors MP3 and MP4 taking into consideration a basic stage 100 having only one biasing structure for the NMOS transistors, as schematically shown in FIG. 8.

In particular, the basic stage 100 comprises a biasing structure 120 comprising MOS biasing transistors MN3 and MN4 of the N-channel type, which are connected in the same way as the biasing transistors of the biasing structure 12 of FIG. 5.

In this case, however, the well terminals of the biasing transistors MN3 and MN4 are connected to the supply voltage reference VDD.

Moreover, the basic stage 100 provides that the bulk terminals of the transistors MP1 and MP2 are connected to the ground GND, eliminating the need to use a biasing structure 11 for those PMOS transistors. In that case, it may be necessary to use high-voltage PMOS transistors. It should be noted that the basic stage 100, except for the depletion effect on the transistors MP1 and MP2 which is inevitable if PMOS transistors are used, still shows the following advantages: it has no direct junctions; the highest voltages applied to the junctions and to the oxide layers are equal to the output voltage from the charge pump circuit: it is possible to use a high frequency clock signal and thus to obtain an area high efficiency circuit; the layout of the basic stages is substantially the same (unless metal options are used) in the case of both a positive or a negative voltage charge pump circuit.

Finally, advantageously, according to an embodiment the invention, it is possible to shift from one configuration to the other for the above-described basic stages by simply changing some suitable metal options.

Furthermore, a memory, such as a flash, EPROM, or EEPROM, can include a charge pump formed by one or more of the stages 10 (FIG. 8). In addition, an electronic system such as a computer system may include such a memory, and another component, such as a processor, may be coupled to the memory.

What is claimed is:

1. Basic stage for a charge pump circuit having at least an input terminal and an output terminal and comprising:
   at least a first inverter inserted between said input and output terminals and comprising a first complementary pair of transistors, defining a first internal node,
   at least a second inverter inserted between said input and output terminals and comprising a second complementary pair of transistors defining a second internal node,
   respective first and second capacitors connected to said first and second internal nodes and receiving first and second driving signals;
   said first and second pairs of transistors having their respective control terminals cross-connected to said second and first internal nodes, wherein the basic stage further comprises at least a first biasing structure connected to said first and second internal nodes and comprising first and second biasing transistors, which are respectively coupled to said first and second inverters, and which are operable to bias the inverters to enable generation of a negative output voltage on the output terminal, wherein said first and second biasing transistors and first transistors, of said first and second inverters are connected through a triple-well technology and have well terminals which are different from bulk terminals of these transistors.

2. Basic stage according to claim 1, wherein said first biasing transistor has a control terminal connected to said second internal node, as well as a drain terminal connected to said first internal node and in that said second biasing transistor has a control terminal connected to said first internal node, as well as a drain terminal connected to said second internal node.

3. Basic stage according to claim 1, wherein said first and second biasing transistors have smaller size than said first transistors of said first and second inverters.

4. Basic stage according to claim 1, wherein the basic stage further comprises a second biasing structure connected to said first and second internal nodes and comprising third and fourth biasing transistors, which are respectively coupled to said first and second inverters.

5. Basic stage according to claim 4, wherein said third biasing transistor has a control terminal connected to said second internal node, as well as a drain terminal connected to said first internal node and in that said fourth biasing transistor has a control terminal connected to said first internal node, as well as a drain terminal connected to said second internal node.

6. Basic stage according to claim 4, wherein said third and fourth biasing transistors have smaller size than second transistors of said first and second inverters.

7. Basic stage according to claim 1, wherein said first and second biasing transistors and said first transistors of said first and second inverters are MOS transistors of the N-channel type.

8. Basic stage according to claim 1, further comprising third and fourth biasing transistors that are coupled to the second transistors of said first and second inverters, respectively, and wherein each of these transistor is a MOS transistors of the P-channel type.

9. Basic stage according to claim 1, wherein said first and second biasing transistors and said first transistors of said first and second inverters are low-voltage transistors.

10. Basic stage according to claim 1, wherein said first and second pairs of transistors are high-voltage transistors.

11. A basic stage for a charge pump circuit having at least an input terminal and an output terminal and comprising:
    at least a first inverter inserted between the input and output terminals and comprising a first complementary pair of transistors, defining a first internal node,
    at least a second inverter inserted between the input and output terminals and comprising a second complementary pair of transistors defining a second internal node,
    respective first and second capacitors connected to the first and second internal nodes and receiving first and second driving signals;

wherein the first and second pairs of transistors having their respective control terminals cross-connected to the second and first internal nodes, wherein the basic stage also comprises at least a first biasing structure connected to the first and second internal nodes and comprising first and second biasing transistors, which are respectively coupled to the first and second inverters; and wherein the basic stage is configured for a negative charge pump circuit by applying a first biasing signal to bulk terminals of the first and second biasing transistors and first transistors of the first and second inverters, and by applying a second biasing signal to bulk terminals of third and fourth biasing transistors and second transistors of the first and second inverters, and applying the second biasing signal to well terminals of the first and second biasing transistors, the third and fourth biasing transistors being coupled to the second transistors of the first and second inverters, respectively, and the first transistors of the first and second inverters being formed in a triple-well technology and being coupled to a supply voltage reference.

12. A basic stage for a charge pump circuit having at least an input terminal and an output terminal and comprising:
- at least a first inverter inserted between the input and output terminals and comprising a first complementary pair of transistors, defining a first internal node,
- at least a second inverter inserted between the input and output terminals and comprising a second complementary pair of transistors defining a second internal node,
- respective first and second capacitors connected to the first and second internal nodes and receiving first and second driving signals;
- the first and second pairs of transistors having their respective control terminals cross-connected to the second and first internal nodes, wherein the basic stage also comprises at least a first biasing structure connected to the first and second internal nodes and comprising first and second biasing transistors, which are respectively coupled to the first and second inverters; and wherein the basic stage is configured for a negative charge pump circuit by applying a first biasing signal to bulk terminals of the first and second biasing transistors and first transistors of the first and second inverters, and by applying a ground voltage reference signal to bulk terminals of third and fourth biasing transistors, to second transistors of the first and second inverters, and to well terminals of the first and second biasing transistors, the third and fourth biasing transistors being coupled to the second transistors of the first and second inverters, respectively, and the first transistors of the first and second inverters being formed in a triple-well technology and being coupled to a supply voltage reference.

13. A negative charge pump circuit comprising a plurality of cascade-connected basic stages, wherein the charge pump includes at least one basic stage as recited in claim 12.

* * * * *

UNITED STATES PATENT AND TRADEMARK OFFICE
CERTIFICATE OF CORRECTION

PATENT NO.         : 7,002,399 B2                                              Page 1 of 1
APPLICATION NO. : 10/402852
DATED              : February 21, 2006
INVENTOR(S)        : Giovanni Nuzzarello and Jacopo Mulatti It is certified that error appears in the above-identified patent and that said Letters Patent is hereby corrected as shown below:

Title page item (30) Foreign Application Priority Data change priority date from "March 28, 2002" to --March 29, 2002--

Signed and Sealed this

Twenty-second Day of May, 2007

JON W. DUDAS
*Director of the United States Patent and Trademark Office*